(12) United States Patent
Kawano et al.

(10) Patent No.: US 6,181,923 B1
(45) Date of Patent: Jan. 30, 2001

(54) AUTOMATIC FREQUENCY CONTROL CIRCUIT AND METHOD OF AUTOMATIC FREQUENCY CONTROL

(75) Inventors: Osamu Kawano; Fujio Inagami, both of Kawasaki (JP)

(73) Assignee: Fujitsu Limited, Kawasaki (JP)

( * ) Notice: Under 35 U.S.C. 154(b), the term of this patent shall be extended for 0 days.

(21) Appl. No.: 09/049,387

(22) Filed: Mar. 27, 1998

(30) Foreign Application Priority Data

Oct. 20, 1997 (JP) .................................................... 9-287484

(51) Int. Cl.[7] .............................. H04L 27/06; H04L 27/18
(52) U.S. Cl. ........................ 455/257; 455/136; 455/164.1; 455/173.1; 455/182.2; 455/192.1; 455/258; 455/260; 455/264; 372/344; 372/371; 327/47; 327/175
(58) Field of Search .............................. 455/192.1, 192.2, 455/215, 245.2, 256, 257, 255, 258, 259, 260, 196.1, 182.2, 164.1, 164.2, 75; 375/344, 362, 371, 372, 374, 375; 327/47, 48, 141, 160, 241; 331/175, 176, 177 R

(56) References Cited

U.S. PATENT DOCUMENTS

| | | | |
|---|---|---|---|
| 5,107,335 | * 4/1992 | Nishiyama et al. | 455/192.2 |
| 5,423,085 | * 6/1995 | Lim | 455/192.2 |
| 5,432,855 | * 7/1995 | Koo et al. | 381/12 |
| 5,436,927 | * 7/1995 | Brady et al. | 455/192.2 |
| 5,633,898 | * 5/1997 | Kishigami et al. | 375/344 |
| 5,727,030 | * 3/1998 | Miyashita | 375/344 |
| 5,768,321 | * 6/1998 | Watanabe et al. | 375/344 |

* cited by examiner

Primary Examiner—Fan Tsang
Assistant Examiner—Simon Nguyen
(74) Attorney, Agent, or Firm—Helfgott & Karas, P.C.

(57) ABSTRACT

The present invention relates to the automatic frequency control circuit and the method of automatic frequency control. The automatic frequency control circuit for processing frequency control of a received signal frequency based on an incoming received signal comprises a first control circuit for processing frequency control based on a precision counter by using the incoming received signal and a second control circuit for processing frequency control based on a coarse counter by using the incoming received signal, wherein the first control circuit and the second control circuit are configured to be used interchangeably in response to the incoming received signal. By employing the circuit which directly counts the received signal and the circuit which counts the regenerative carrier signal in combination, the follow up range of the automatic frequency control circuit is thus expanded.

15 Claims, 9 Drawing Sheets

AUTOMATIC FREQUENCY CONTROL CIRCUIT AND METHOD OF AUTOMATIC FREQUENCY CONTROL

BACKGROUND OF THE INVENTION (1) Field of the Invention

This invention relates to, for example, automatic frequency control circuit and method of automatic frequency control preferable for use with portable telephone terminal.

(2) Description of the Related Art

Generally, automatic frequency control circuit (AFC circuit) is a circuit which controls reference frequency in the synthesizer (received local generation unit) of terminal station (portable station) according to the quantity of a drift, after counting stable terminating frequency from the base station, when a drift with predetermined theoretical value exists. Also, terminating frequency is configured to be counted at the point of received intermediate frequency signal (hereinafter called as received IF signal).

Because the status of radio wave at the portable station (portable telephone terminal) is always changing by receiving fading phenomena, and etc., to average these effects, sufficient counting time is necessary for precise measurement. On the other hand, the equipment, like a digital portable telephone, which operates with TDMA (Time Division Multiple Access) system during receiving period, can only measure frequency of receiving slot of itself during TDMA operation (that is, during conversation), thus, longer counting time is also necessary for sufficient counting process. Therefore, a longer time $(T/S) \times F$ becomes necessary, where T is a time, F is a time of one frame, and S is a time of the receiving slot of itself.

Because of this, in portable station, there are many cases counting not received IF signal itself, but reference carrier of detected signal which is regenerated in the demodulator circuit (DEM circuit) in receiving unit of portable station. That is to say, because influence of fading is suppressed, regenerative carrier signal can be counted more precisely within short period of time than counting received IF signal directly.

However, as stated above, in case of automatic frequency control circuit counting reference carrier of detected signal regenerated in demodulator circuit, the limit of frequency follow up of the demodulator circuit becomes the limit of frequency follow up of the automatic frequency control circuit itself. That is to say, the demodulator circuit, in most cases, is simplified as not to be equipped with unnecessary circuit other than enough circuit for detection, in order to reduce the scale of the circuitry, and to easily integrate in large scale. Therefore, frequency limit of follow up as stated above has been produced. In certain instances, there may be some cases when the frequency limit of follow up will theoretically be produced by the detection system.

Specifically, as shown in FIG. 9, the carrier regeneration circuit which is configured with the digital circuit of demodulator circuit has the limit of follow up range ["−FL~+FL" (2|FL|) cf. A in FIG. 9] against input frequency (received IF frequency). With the input frequency which is out of this limit of follow up range, output frequency (regenerative carrier frequency) repeats identical value. Therefore, in the area out of the limit of follow up range, ratio of value between output frequency and input frequency does not coincide with. On the other hand, when a synthesizer using highly stable local oscillator is equipped in portable station, this synthesizer becomes expensive, and the total cost of whole portable station will be boosted in turn.

SUMMARY OF THE INVENTION

The object of the present invention is to provide an automatic frequency control circuit and a method of automatic frequency control, which is able to expand follow up range of the automatic frequency control circuit, by employing a circuit which directly counts the received signal and a circuit which counts regenerative carrier signal in combination.

Therefore, the automatic frequency control circuit according to the present invention is characterized in that, the automatic frequency control circuit processing frequency control of the received signal frequency based on the incoming received signal, comprising; a first control circuit for processing frequency control based on precision counter by using above mentioned incoming received signal; and a second control circuit for processing frequency control based on coarse counter by using above mentioned incoming received signal; wherein above mentioned first control circuit and above mentioned second control circuit are used interchangeably in response to the incoming received signal.

Moreover, the automatic frequency control circuit according to the present invention is characterized in that, the automatic frequency control circuit processing frequency control of the received signal frequency based on the incoming received signal, comprising; a first counter for counting frequency of regenerative carrier signal which is generated based on above mentioned incoming received signal; a second counter for counting frequency of above mentioned incoming received signal; a first reference value setting circuit having first reference value for regenerative carrier signal; a second reference value setting circuit having second reference value for received signal; a first comparator for comparing the first reference value outputted from above mentioned first reference value setting circuit with the output of above mentioned first counter; a second comparator for comparing the second reference value outputted from above mentioned second reference value setting circuit with the output of above mentioned second counter; a selection circuit for selecting either of output from above mentioned first comparator and output from above mentioned second comparator; a frequency control signal generation unit for outputting frequency control signal for processing frequency control of above mentioned received signal frequency based on the output of the selection circuit; a control signal output unit for outputting selective switching control signal in response to incoming received signal.

In addition, the automatic frequency control circuit according to the present invention is characterized in that, the automatic frequency control circuit, wherein above mentioned frequency control signal generation unit comprises; a control pulse generation circuit for generating control pulse signal based on output from above mentioned selection circuit; and an up/down counter for outputting frequency control signal by increasing or decreasing count value in response to control pulse signal from the control pulse generation circuit.

Moreover, the automatic frequency control circuit according to the present invention is characterized in that, the automatic frequency control circuit, wherein above mentioned control signal output unit comprises; a selection control signal generation unit for outputting selection control signal for selecting either of output from above mentioned first comparator and output from above mentioned second comparator; and a gate generation circuit for outputting each of the counting time in above mentioned first counter and in above mentioned second counter based on the selection control signal from the selection control signal generation unit.

Therefore, according to the automatic frequency control circuit of the present invention, when drift of received frequency exceeds the limit of follow up of the demodulator circuit, the frequency of the regenerative carrier signal can be controlled within the limit of follow up range, by counting the received IF signal directly using auxiliary counter, thus the follow up range of the automatic frequency control circuit can be expanded, and the processing capability is greatly increased.

In addition, the automatic frequency control circuit according to the present invention is characterized in that, the automatic frequency control circuit processing frequency control of the received signal frequency based on the incoming received signal, comprising; a selection circuit for selecting either of the frequency of regenerative carrier signal generated based on above mentioned incoming received signal and the frequency of the received signal; a counter for counting frequency of output by receiving the output of the selection circuit; a reference value setting circuit having first reference value for regenerative carrier signal and second reference value for received signal, and selectively outputting above mentioned first reference value and above mentioned second reference value in response to switching of above mentioned selection circuit; a comparator for comparing the first reference value and the second reference value selectively outputted from above mentioned reference value setting circuit by receiving output of above mentioned counter; a frequency control signal generation unit for outputting frequency control signal for processing frequency control of the received signal frequency based on the output of the comparator; and a control signal output unit for outputting selective switching control signal in response to above mentioned incoming received signal.

Moreover, the automatic frequency control circuit according to the present invention is characterized in that, the automatic frequency control circuit, wherein above mentioned frequency control signal generation unit comprises; a control pulse generation circuit for generating control pulse signal based on output from above mentioned comparator; and an up/down counter for outputting frequency control signal by increasing or decreasing count value in response to the control pulse signal from above mentioned control pulse generation circuit.

In addition, the automatic frequency control circuit according to the present invention is characterized in that, the automatic frequency control circuit, wherein above mentioned control signal output unit comprises; a selection control signal generation unit for outputting selection control signal for selecting output of either of the frequency of the regenerative carrier signal generated based on the received signal and the frequency of the received signal; and a gate generation circuit for outputting the counting time in above mentioned counter based on the selection control signal from the selection control signal generation unit.

Therefore, according to the automatic frequency control circuit of the present invention, because a single counter can count by switching the counting speed in response to the input signal based on the received signal, circuit configuration can be reduced, and the whole equipment can be configured in light weight, thus reduction of cost will be achieved. Moreover, according to the present invention, because the counter can rapidly respond to different speed counting process which is started in either speed, flexibility of the system configuration of the equipment will be achieved.

Moreover, the method of automatic frequency control according to the present invention is characterized in that, the method of automatic frequency control, wherein the automatic frequency control circuit includes the precision counter and the coarse counter each counting frequency of the received signal based on the input signal resulting from the received signal, comprising the steps of;

input signal being precision-counted and coarse-counted by above mentioned precision counter and above mentioned coarse counter respectively;

coarsely counted value counted by coarse counter being compared with the reference value for coarse counting, and from this comparing result, decision being made whether difference between the coarsely counted value and the reference value for coarse counting stays within the limit of the follow up range on the basis of the regenerative carrier signal;

from a result of this decision, when the difference between the coarsely counted value and the reference value for coarse counting exceeds the limit of the follow up range, while processing frequency control, as long as the number of times which exceeded limit of the follow up range is within the prescribed range;

when the difference between the coarsely counted value and the reference value for coarse counting does not exceed the limit of the follow up range, decision being made whether the frequency of the input signal stays within the convergence range, from the comparing result of the precisely counted value counted by the precision counter with the reference value for precision counting;

when the frequency of the input signal exceeds the convergence range, while processing frequency control, as long as the number of times which exceeded the convergence range is within the prescribed range; and then frequency control processing being completed, when the frequency of the input signal stays within the convergence range, and when there is no out of synchronization in the input signal.

In addition, the method of automatic frequency control according to the present invention is characterized in that, the method of automatic frequency control comprising the steps of;

restoring previous value just reached the limit of the convergence range mentioned above, when the number of times which exceeded above mentioned convergence range exceeds the prescribed range;

then frequency control processing employing the precision counter being forcibly completed; wherein the frequency control processing employs above mentioned precision counter.

Moreover, the method of automatic frequency control according to the present invention is characterized in that, the method of automatic frequency control, wherein the frequency control processing employs above mentioned coarse counter, comprising the steps of;

restoring previous value just reached the limit of the follow up range mentioned above, when the number of times which exceeded above mentioned follow up range exceeds the prescribed range;

then frequency control processing employing the coarse counter being forcibly completed Therefore, according to the method of automatic frequency control of the present invention, even when drift of the received frequency exceeds the limit of follow up of the demodulator circuit, the frequency of the regenerative carrier signal can be controlled within the limit of the follow up range, by counting the received IF signal directly using auxiliary counter, thus the follow up range of the automatic frequency control circuit can be expanded, and the processing capability is greatly increased.

In addition, the method of automatic frequency control according to the present invention is characterized in that, the method of automatic frequency control, wherein the automatic frequency control circuit includes the counter precisely and coarsely counting the frequency of the received signal based on the input signal resulting from the received signal, comprising the steps of;

precisely counting the input signal by above mentioned counter;

precisely counted value precisely counted by the counter being compared with the reference value for precision counting;

from this comparing result, decision being made whether the frequency of the input signal stays within the convergence range;

while frequency control processing being completed, when the frequency of above mentioned input signal stays within the convergence range and when there is no out of synchronization in the input signal;

when the frequency of above mentioned input signal exceeds above mentioned convergence range, while processing frequency control, as long as the number of times which exceeded convergence range is within the prescribed range;

when the number of times which exceeded the convergence range exceeds the prescribed range, coarsely counting by above mentioned coarse counter;

coarsely counted value coarsely counted by the counter being compared with the reference value for coarse counting; and then based on this comparing result, processing above mentioned frequency control.

Moreover, the method of automatic frequency control according to the present invention is characterized in that, the method of automatic frequency control, wherein frequency control processing employs coarse counting by above mentioned coarse counter, comprising the steps of;

restoring previous value just reached the limit of the follow up range mentioned above, when the number of times where the difference between the coarsely counted value and the reference value for coarse counting exceeded the limit of the follow up range on the basis of the regenerative carrier signal exceeds the prescribed range, then frequency control processing employing the coarse counting by above mentioned counter being forcibly completed.

In addition, the method of automatic frequency control according to the present invention is characterized in that, the method of automatic frequency control, wherein the automatic frequency control circuit includes the counter precisely and coarsely counting the frequency of the received signal based on the input signal resulting from the received signal, comprising the steps of;

coarsely counting the input signal by above mentioned counter;

coarsely counted value coarsely counted by the counter being compared with the reference value for coarse counting;

from this comparing result, decision being made whether the difference between above mentioned coarsely counted value and above mentioned reference value for coarse counting stays within the limit of the follow up range on the basis of regenerative carrier signal;

from a result of this decision, when the difference between above mentioned coarsely counted value and reference value for coarse counting exceeds the above mentioned limit of the follow up range, while processing frequency control, as long as the number of times which exceeded above mentioned limit of the follow up range is within the prescribed range;

when the difference between above mentioned coarsely counted value and the reference value for coarse counting does not exceed the above mentioned limit of the follow up range, after precisely counting above mentioned counter, precisely counted value precisely counted by the counter being compared with the reference value for precision counting;

from this comparing result, decision being made whether the frequency of above mentioned input signal stays within the convergence range;

while frequency control processing being completed, when the frequency of above mentioned input signal stays within the convergence range and when there is no out of synchronization in the input signal;

when the frequency of the input signal exceeds the convergence range, processing frequency control, as long as the number of times which exceeded above mentioned convergence range is within the prescribed range.

Moreover, the method of automatic frequency control according to the present invention is characterized in that, the method of automatic frequency control, wherein the frequency control processing employs coarse counting by above mentioned counter, comprising the steps of;

restoring previous value just reached the limit of the follow up range mentioned above, when the number of times exceeded above mentioned limit of the follow up range exceeds the prescribed range, then frequency control processing employing the coarse counting by above mentioned counter being forcibly completed.

In addition, the method of automatic frequency control according to the present invention is characterized in that, the method of automatic frequency control, wherein frequency control processing employs precision counting by above mentioned counter, comprising the steps of;

restoring previous value before exceeding the limit of the convergence range mentioned above, when the number of times exceeded above mentioned limit of the convergence range exceeds the prescribed range;

then frequency control processing employing the precision counting by the counter being forcibly completed.

Therefore, according to the method of automatic frequency control of the present invention, because a single counter can count by switching the counting speed in response to the input signal based on received signal, circuit configuration can be reduced, and the whole equipment can be configured in light weight, thus reduction of cost will be achieved. Moreover, according to the present invention, because the counter can rapidly respond to different speed counting process which is started in either speed, flexibility of the system configuration of the equipment will be achieved.

Figure 1:
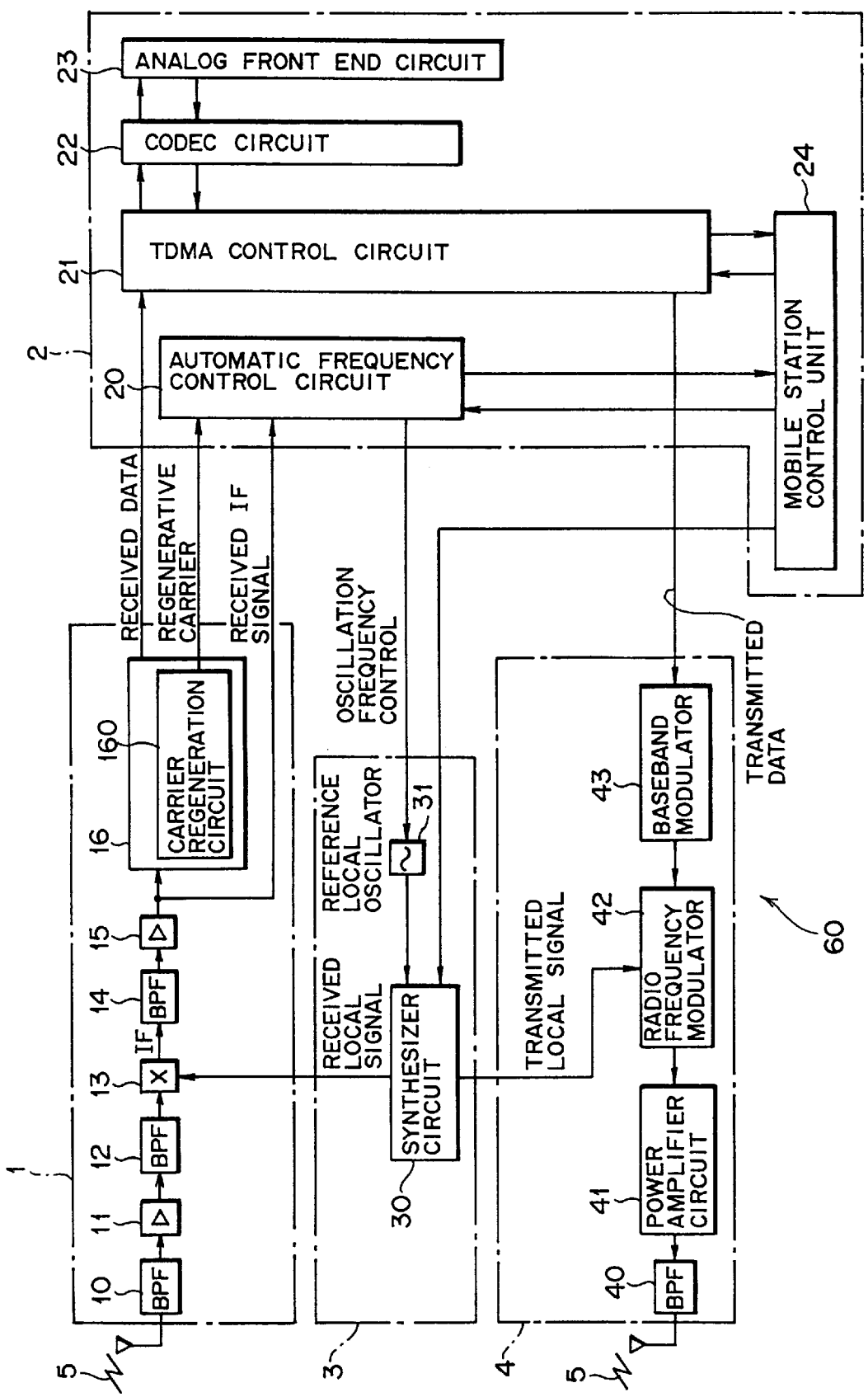
FIG. 1 is a block diagram showing configuration of the portable telephone terminal including automatic frequency control circuit according to the first embodiment of the invention.

DESCRIPTION OF THE PREFERRED EMBODIMENTS (a) Detailed description of the first preferred embodiment of the present invention Referring now to the drawings, one preferred embodiment of the present invention will be described.

FIG. 1 is a block diagram showing configuration of the portable telephone terminal including automatic frequency control circuit (AFC circuit) according to the first preferred embodiment of the invention. Portable telephone terminal 60 shown in this FIG. 1, includes a receiving unit 1, a received signal processing unit 2, a synthesizer unit 3 and a transmitting unit 4.

As described below, the receiving unit 1 receives output from base station via wireless line 5, and includes, for example, as shown in FIG. 1, a first bandpass filter 10, a low noise amplifier unit 11, a second bandpass filter 12, a receiving mixer 13, a third bandpass filter 14, an amplifier unit 15 and a demodulator circuit 16. Incoming signal is filtered by the first bandpass filter (BPF) 10. The low noise amplifier unit (LNA) 11 receives and amplifies the output from the first bandpass filter 10. The output from the low noise amplifier unit 11 is filtered by the second bandpass filter (BPF) 12.

Further, the frequency of the received signal which is filtered by the second bandpass filter 12, is converted by the receiving mixer 13, based on output from the synthesizer unit 3 mentioned later. Specifically, as hereinafter described, radio frequency (hereinafter called as RF) signal is frequency converted (down conversion) to intermediate frequency (hereinafter called as IF) signal by using LO signal from the synthesizer unit 3 (received local signal: local oscillator output).

Furthermore, the output from the receiving mixer 13 is filtered by the third bandpass filter (BPF) 14. The amplifier unit (limiter AMP) 15 amplifies the output from the third bandpass filter 14 and outputs it as phase information. In automatic frequency control circuit 20 which is mentioned later, the received IF signal frequency can be measured, based on this phase information, by counting number of times of the leading edges of the signal for predetermined gate period.

Furthermore, the demodulator circuit (DEM) 16, which demodulates the output of the amplifier unit 15, includes a carrier regeneration circuit 160, as shown in the FIG. 1. This carrier regeneration circuit 160 reproduces carrier itself to specify phase position of the career information in detection. Next, the received signal processing unit 2 receives output from the receiving unit 1, processes the output as required for transmission to the transmitting unit 4 mentioned later. The received signal processing unit 2 includes the automatic frequency control circuit (AFC circuit) 20, a TDMA (Time Division Multiple Access) control circuit 21, a codec circuit 22, an analog front end circuit 23 and a mobile station control unit 24.

Hereupon, the automatic frequency control circuit 20 processes frequency control processing of the received signal frequency, based on the incoming received signal, and is controlled starting or completion of its operation by a mobile station control unit 24 mentioned later. Further, this automatic frequency control circuit 20 will be described later with reference to FIG. 3. Further, a TDMA control circuit 21 picks up digital signal from the demodulator circuit 16 by bit unit at regular intervals, and establishes bit synchronization. Thus, this signal which is picked up from the TDMA circuit 21 is decoded in the mobile station control unit 24 mentioned later.

Furthermore, the codec circuit 22 converts the digital signal, synchronization of which has been established, into analog signal, in the TDMA circuit 21, and also converts analog signal from the analog front end circuit 23 which will be mentioned later into digital signal. The analog front end circuit 23 outputs analog signal from the codec circuit 22 as a voice signal in reception of signal, and in transmission of signal, outputs the input voice signal into the codec circuit 22 as analog signal.

Further, the mobile station control unit 24 decodes the received signal from the base station, and processes required operation to each of the above mentioned circuit. For example, it is consisted of a central processing unit (CPU) and a firm ware (micro program). Specifically, this mobile station control unit 24, as described above, besides transmits a control signal for starting or completion of the automatic frequency control circuit 20, decodes the signal which is picked up in TDMA circuit 21 at regular intervals. Furthermore, this mobile station control unit 24 controls frequency used in the synthesizer unit 3 mentioned later. In addition to above, although in this preferred embodiment, the required control 6 in each circuit as described above is performed in the mobile station control unit 24, it may be performed in each circuit respectively.

Next, the synthesizer unit 3 shown in FIG. 1, outputs the received local signal (LO signal) for varying frequency of the input signal, and includes a synthesizer circuit 30 and a local oscillator 31. Hereupon, the local oscillator (reference local oscillator) 31 outputs the most stable reference carrier, based on the oscillation frequency control signal from the automatic frequency control circuit 20. The synthesizer circuit 30 outputs the received local signal and transmitted local signal to above mentioned receiving mixer 13 and transmitting unit 4 which will be mentioned later, based on the output (reference value) from the local oscillator 31 and the output (frequency control signal) from the mobile station control unit 24.

Figure 2:
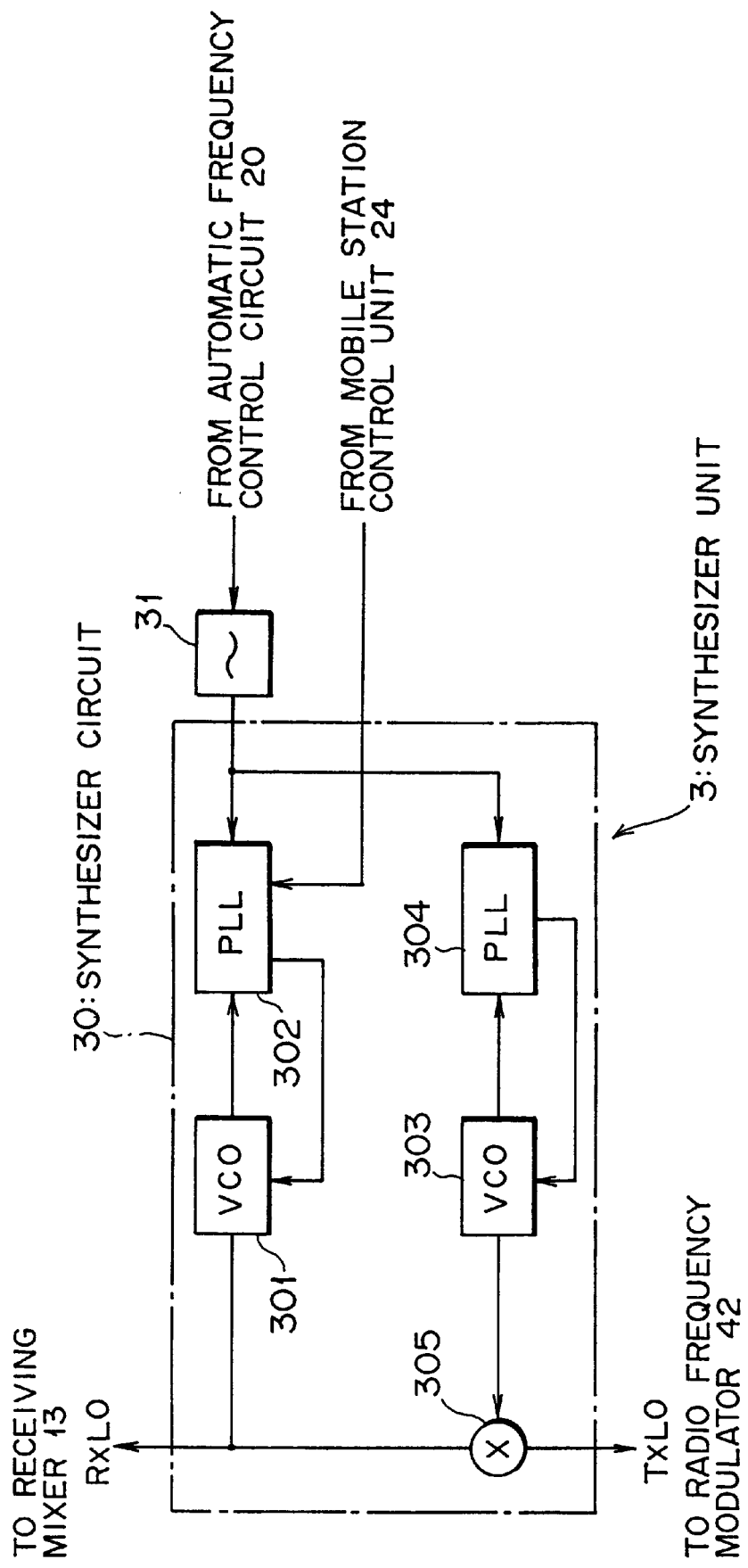
FIG. 2 is a block diagram showing essential part of the portable telephone terminal including automatic frequency control circuit according to the first embodiment of the invention.

In other words, output corresponding to the predetermined frequency in the base station is outputted from the mobile station control unit 24. This predetermined frequency is compared with the reference value from the local oscillator 31, then the synthesizer circuit 30 outputs a signal corresponding to the comparing result. Further, above mentioned synthesizer circuit 30, as shown specifically in FIG. 2, includes a first voltage controlled oscillator 301, a first PLL circuit 302, a second voltage controlled oscillator 303, a second PLL circuit 304 and a multiplier 305.

Hereupon, the first voltage controlled oscillator (VCO) 301 outputs oscillation frequency (f). The first phase locked loop circuit (PLL circuit) 302 receives a signal from the local oscillator 31, then counts oscillation frequency from the first voltage controlled oscillator 301. As described above, the first PLL circuit outputs the voltage to the first voltage controlled oscillator 301 to control the oscillation frequency, based on the output from the mobile station control unit 24 shown in FIG. 2 (frequency setting signal).

Thus, the first voltage controlled oscillator 301 outputs the frequency (locked value) generated by the first voltage controlled oscillator 301 per se and the first PLL circuit 302 to the receiving mixer 13. Frequency channel of the input signal is controlled by this output (R×LO; received local signal). Further, this output from the first voltage controlled oscillator 301 is transmitted to the multiplier 305 which will be mentioned later.

Further, the second voltage controlled oscillator (VCO) 303 outputs oscillation frequency, same as above stated first voltage controlled oscillator 301. The second phase locked loop circuit (PLL circuit) 304 receives a signal from the local oscillator 31, then counts oscillation frequency from the second voltage controlled oscillator 303. The frequency which is generated by this second phase locked loop circuit 304 and the second voltage controlled oscillator 303 is a fixed value (for example 130 MHz).

Furthermore, the multiplier 305 multiplies the output from the first voltage controlled oscillator 301 and the output from the second voltage controlled oscillator 303. The output from this multiplier 305 (T×LO; transmitted local signal) is outputted to the transmitting unit 4 (the radio frequency modulator 42) which will be mentioned later, establishing frequency channel of the transmission signal. In other words, frequency of the received local signal and the frequency of the transmitted local signal are always established by fixed spacing, by this multiplier 305.

Further, the transmitting unit 4 shown in FIG. 1, transmits the signal which was processed in the portable telephone terminal 60, to the base station via wireless line 5, and includes, for example, as shown in FIG. 1, a fourth bandpass filter 40, a power amplifier circuit 41, a radio frequency modulator 42 and a baseband modulator 43. Here, the baseband modulator 43 generates modulated base band signal (BB signal). The radio frequency modulator 42 frequency converts modulated baseband from the baseband modulator 43 into RF signal, modulation (up conversion) is based on the transmitted local signal from the synthesizer circuit 30.

Figure 3:
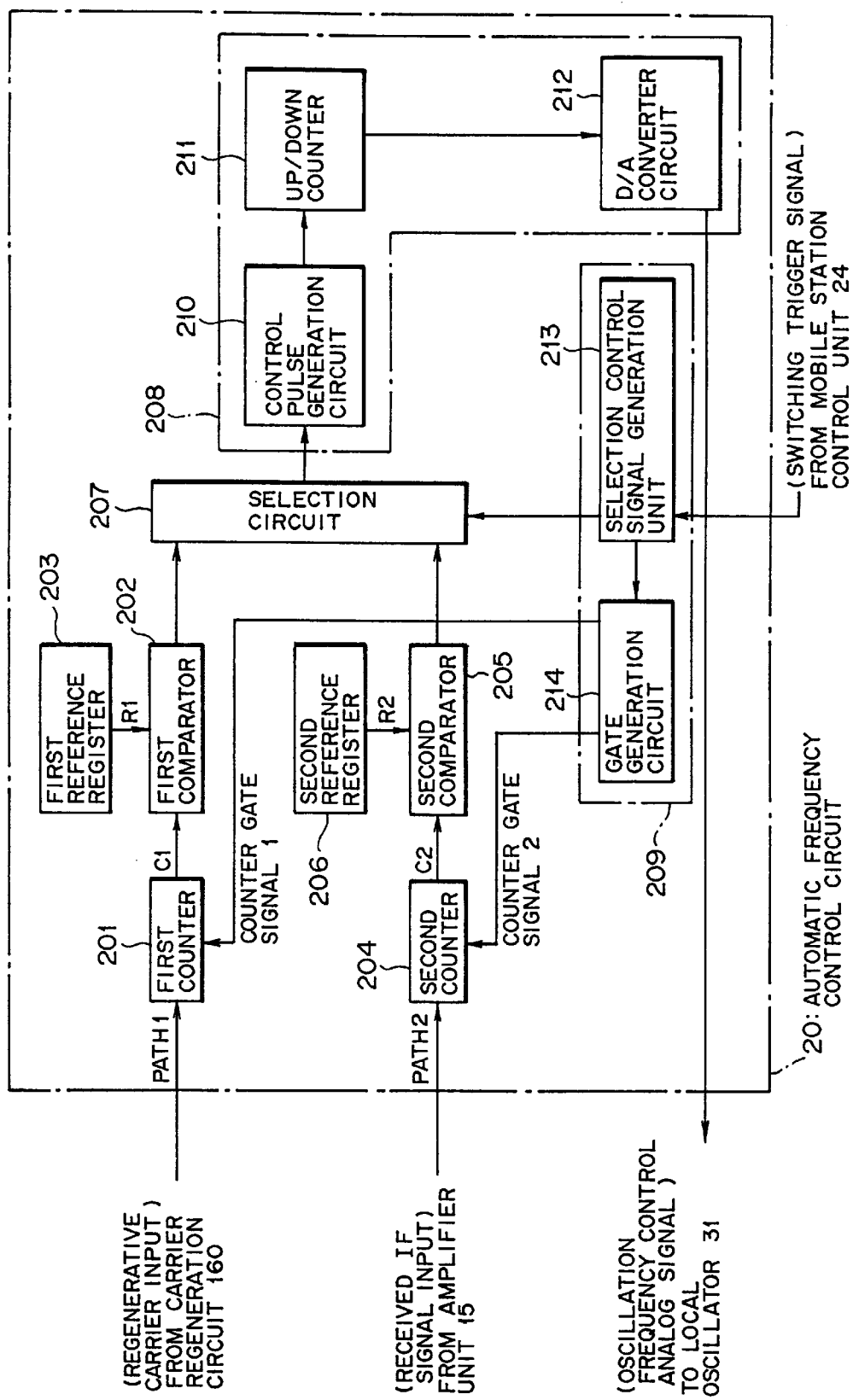
FIG. 3 is a block diagram showing configuration of automatic frequency control circuit according to the first embodiment of the invention.

Further, the power amplifier circuit 41 amplifies the output from the radio frequency modulator 42. The fourth bandpass filter (BPF) 40 filters the output from the power amplifier circuit 41. The output is transmitted to the base station via wireless line 5. Next, FIG. 3 is a block diagram showing a configuration of the automatic frequency control circuit according to the first preferred embodiment of the invention. As shown in this FIG. 3, the automatic frequency control circuit 20 includes a first counter 201, a first comparator 202, a first reference register 203, a second counter 204, a second comparator 205, a second reference register 206, a selection circuit 207, a control pulse generation circuit 210, an up/down counter 211, a digital to analog conversion circuit 212, a selection control signal generation unit 213 and a gate generation circuit 214.

Here, the first counter (precision counter) 201 counts frequency (PATH 1) of the regenerative carrier signal which is generated based on the incoming received signal (hereinafter, sometimes called received IF signal). Specifically, interval of the counting is adjusted in response to prescribed counting time outputted from the gate generation circuit 214 which will be mentioned later.

In other words, because in the regenerative carrier signal the effect of fading is suppressed, more precise counting (precision counting) within a short period of time can be done, than counting directly received IF signal which is counted in the second counter 204 mentioned later. Further, the first comparator 202 compares output of the first counter 201 (C1; first count value) with the first reference value. This first reference value is outputted from the first reference register 203 which will be mentioned later.

Furthermore, the first reference register (first reference value setting circuit) 203, having the first reference value for the regenerative carrier signal [R1; reference value for precision counting (theoretical value)], is outputted from the first comparator 202. Furthermore, this first reference value (theoretical value) is established in a design stage. Moreover, this first comparator 202, after comparing the first count value (C1) from the first counter 201 with the first reference value (R1), outputs the comparison result (C1−R1) to the selection circuit 207 which will be mentioned later.

Further, the second counter (coarse counter) 204 counts frequency (PATH 2) of the incoming received signal (received IF signal). Specifically, same as the first counter 201, interval of the counting is adjusted in response to the prescribed counting time outputted from the gate generation circuit 214 which will be mentioned later. In other words, this second counter 204 directly counts the received IF signal from the amplifier unit 15, thus counting larger spacing coarse counting (low accuracy counting) when compared with the first counter 201, instead of counting the regenerative carrier as above mentioned first counter 201.

Further, the second comparator (second comparator) 205 compares the output of the second counter 204 (C2; second count value) with the second reference value. This second reference value is outputted from the second reference register 206 which will be mentioned later. Furthermore, the second reference register (second reference value setting circuit) 206, having the second reference value for the received signal [R2; reference value for coarse counting (theoretical value)], is outputted from the second comparator 205. Furthermore, this second reference value (theoretical value) is established in a design stage, same as the first reference value as described above.

Moreover, after comparing the second count value (C2) from the second counter 204 with the second reference value (R2), this second comparator 205 outputs the comparison result (C2−R2) to selection circuit 207 which will be mentioned later. Further, selection circuit 207 selecting either of the output from the first comparator 202 and the output from the second comparator 205, selects either one of the output from these two comparators, based on the output from the selection control signal generation unit 213 which will be mentioned later.

Furthermore, the control pulse generation circuit 210 generates the control pulse signal based on the output from the selection circuit 207. The up/down counter 211 increases or decreases the count value in response to the control pulse signal from the control pulse generation circuit 210, and outputs the frequency control signal. The digital to analog conversion circuit (D/A conversion circuit) 212 converts digital signal output from the control pulse generation circuit 210 into analog signal, the digital signal output being provided through the up/down counter 211.

Furthermore, above mentioned control pulse generation circuit 210 and up/down counter 211 are configured as the frequency control signal generation unit 208. In other words, this frequency control signal generation unit 208 outputs the frequency control signal to process required operation for the frequency control processing of the received signal frequency based on the output from the selection circuit 207.

Further, the selection control signal generation unit 213 outputs a selection control signal to select either one of output from the first comparator 202 or output from the second comparator 205, the output being outputted to the selection circuit 207 and the gate generation circuit 214 which will be mentioned later. Specifically, as described above, the selection control signal is outputted based on switching trigger signal from the mobile station control unit 24 shown in FIG. 1.

In other words, the selection circuit 207 selects the output from the first comparator 202, when the frequency of the regenerative carrier signal is within the limit of follow up range, and selects the output from the second comparator 205, when the frequency of the regenerative carrier signal is out of the limit of follow up range. Furthermore, the gate generation circuit 214 outputs counting time of the first counter 201 and the second counter 204 respectively, based on the selection control signal from the selection control signal generation unit 213. In this first preferred embodiment, the first counter 201 outputs an enable signal (counter gate signal 1) in every 200 msec, for example, and the second counter 204 simultaneously outputs an enable signal (count gate signal 2) every 1 sec, for example. In the above mentioned first counter 201 and second counter 204, each counter counts the incoming pulse signal of 450 KHz, for example, respectively for prescribed period of time, based on the enable signal outputted from this gate generation circuit 214.

In other words, the second counter 204 counts the pulse of 450 KHz during 1 sec, and the first counter 201 counts the pulse of 90 K (one fifth of second counter 204) during 200 msec. Furthermore, above mentioned selection control signal generation unit 213 and gate generation circuit 214 are configured as the control signal output unit 209. This control signal output unit 209 outputs the selective switching control signal in response to the incoming received signal.

In this manner, above mentioned automatic frequency control circuit 20 is configured with the duplicate frequency control processing system comprising the first control circuit and the second control circuit. The first control circuit processes frequency control based on the first counter 201 by using the incoming received signal, and consists of the first counter 201, the first comparator 202, the first reference register 203, the selection circuit 207, the frequency control signal generation unit 208. The second control circuit processes frequency control based on the second counter 204 by using the incoming received signal, and consists of the second counter 204, the second comparator 205, the second reference register 206, the selection circuit 207, the frequency control signal generation unit 208. The above mentioned automatic frequency control circuit 20 employs the first control circuit and the second control circuit alternatively by switching in response to the incoming received signal.

Consequently, the automatic frequency control circuit 20 can automatically control frequency in stability, even if a low stability and low cost reference local oscillator may be employed for the synthesizer unit 3. Accordingly, the portable telephone terminal 60 may precisely control the transmission and reception frequency. The portable telephone terminal 60 which is equipped with the automatic frequency control circuit 20 con figured as described above, and according to the first preferred embodiment of this invention, as shown in FIG. 1, in the reception operation, when a incoming signal arrives from base station, the signal is filtered by the first bandpass filter 10, and amplified in the low noise amplifier unit 11, and again filtered by the second bandpass filter 12.

Thereafter, the output from the second bandpass filter 12 is converted down in the receiving mixer 13 to IF signal, band-limited by the third bandpass filter 14, and then amplified by the amplifier unit 15. And, the signal which was amplified in this amplifier unit 15 is outputted to the TDMA control circuit 21 by the demodulator circuit 16 as received data. on the other hand, the regenerative carrier signal is generated by the carrier regeneration circuit 160 of the demodulator circuit 16, and is outputted to the automatic frequency control circuit 20. Furthermore, one part of a signal amplified by the amplifier unit 15 (received IF signal) is outputted to the automatic frequency control circuit 20, without passing through the demodulator circuit 16.

While frequency control processing corresponding to the received signal frequency is performed by using the received regenerative carrier signal or by using the received IF signal in the automatic frequency control circuit 20, in the TDMA control circuit 21, the received data, which is a digital signal, from the demodulator circuit 16 is picked up by bit unit at regular intervals. The digital signal is converted to analog signal in the codec circuit 22, and is outputted as a voice signal from the analog front end circuit 23.

On the other hand, in transmission operation, voice signal from the analog front end circuit 23 is converted into digital signal in the codec circuit 22, is picked up by bit unit in the TDMA control circuit 21 at regular intervals, and then is outputted as transmission data. Thereafter, the transmission data from this TDMA control circuit 21 is converted into modulated baseband by the baseband modulator 43, up converted into RF signal by the radio frequency modulator 42 based on the transmitted local signal from the synthesizer circuit 30, amplified by the power amplifier circuit 41, band-limited by the fourth bandpass filter 40, and then transmitted to the base station via wireless line 5.

Incidentally, method of automatic frequency control by the automatic frequency control circuit 20 according to the first preferred embodiment of the present invention will now be explained with reference to flow a chart shown in FIG. 4 (from step a1 to a12). Firstly, when the regenerative carrier signal and the received IF signal is inputted, the regenerative carrier signal is counted in the first counter 201 [the first count value (C1); step a1 of FIG. 4], and the received IF signal is coarsely counted in the second counter 204 [the second count value (C2) ; step a2 of FIG. 4]. Thereafter, the first counter 201 is put into waiting state, based on predetermined decision by the second counter 204.

In other words, at this time, when the received IF signal is coarsely counted by the second counter 204, this counted value which is the second count value (C2) is compared with the second reference value (R2) from the second reference register 206 (R2). From this comparing result, the decision is made whether the difference between the second count value and the second reference value (C2−R2) is within the limit of the follow up range on the basis of the regenerative carrier signal or not ("FL≧|C2−R2|?"; step a9 of FIG. 4).

From the result of the decision, when the difference between the second count value and the second reference value exceeds the limit of the follow up range mentioned above ("No" route of step a9 in FIG. 4), the decision is made again whether the number of times which exceeded the limit of the follow up range (the number of times exceeding the limit of the follow up range) is within the prescribed range (for example, less than five times) or not (step a10 of FIG. 4), and when the number of times which exceeded the limit of the follow up range is within the prescribed range ("Yes" route of step a10 of FIG. 4) frequency control processing is performed (step a11 of FIG. 4).

Furthermore, when the number of times which exceeded the follow up range exceeds the prescribed range ("No" route of step a10 of FIG. 4), after restoring previous value just reached the limit of the follow up range (step a12 of FIG. 4), then frequency control processing employing the second counter 204 will be forcibly completed. On the other hand, in above mentioned step a9 of FIG. 4, when the difference between the second count value and the second reference value does not exceed the limit of the follow up range ("Yes" route of step a9 of FIG. 4), the frequency control processing using the first counter 201 will be performed.

Figure 4:
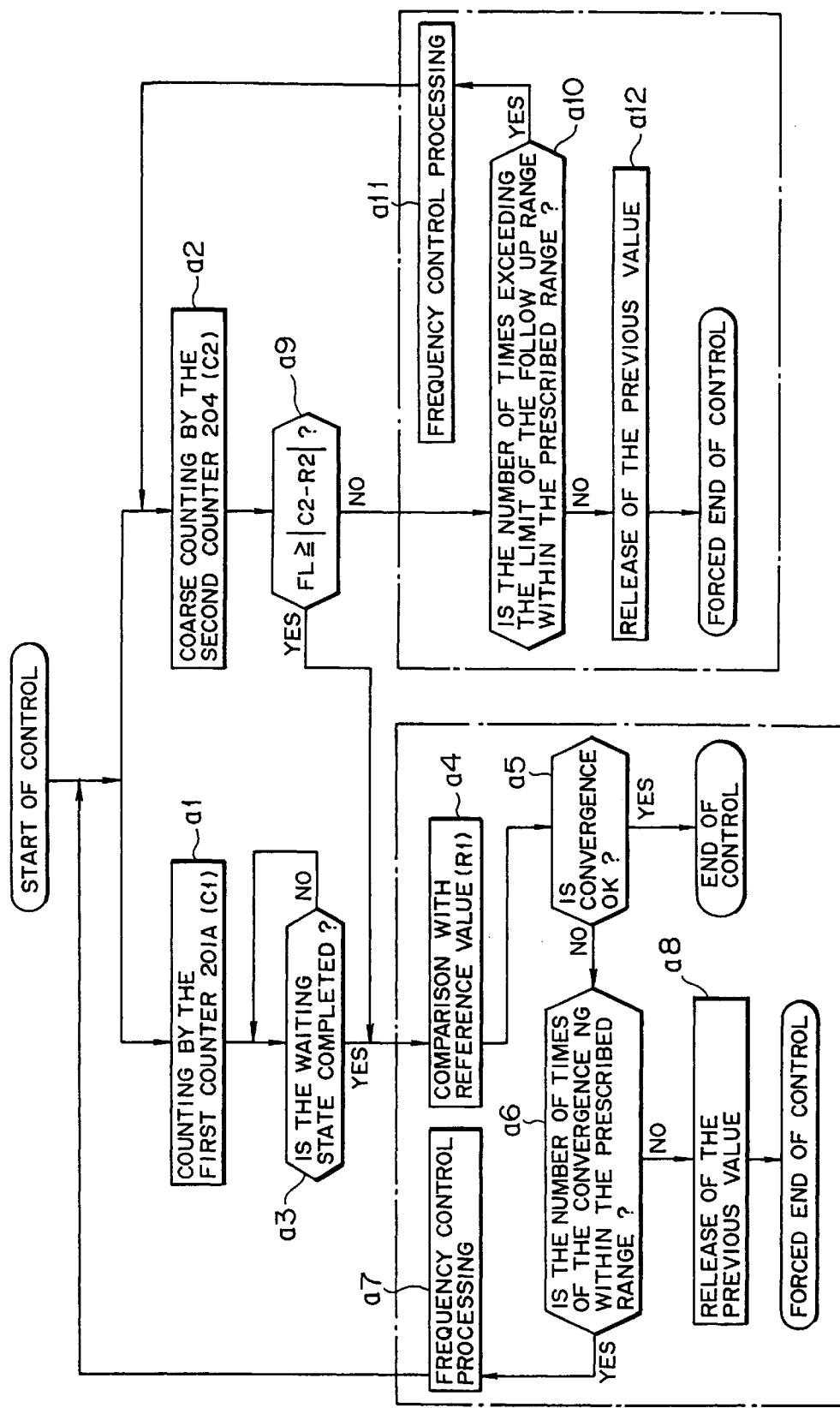
FIG. 4 is a flow chart explaining operation of automatic frequency control circuit according to the first embodiment of the invention.

In other words, the first counter 201 judges whether the waiting state was cancelled or not, based on the prescribed decision by the above mentioned second counter 204 (step a3 of FIG. 4). When the waiting state is not cancelled ("No" route of step a3 of FIG. 4), the waiting state will be continued until the waiting state is cancelled. When the waiting state is cancelled ("Yes" route of step a3 of FIG. 4), the first counter 201 compares the first count value (C1) counted by the first counter 201 with the first reference value (R1) (step a4 of FIG. 4). Furthermore, when the condition is satisfied to take "Yes" route in step a9, the waiting state will be cancelled.

And from this comparing result, the decision is made whether the frequency of the input signal is within the convergence range or not ["convergence OK?" ($|C1-R1| \leq$ control threshold value ?) step a5 of FIG. 4]. When it is out of the convergence range ("No" route of step a5 of FIG. 4), the first counter 201 judges whether the number of times which exceeded the limit of the convergence range (number of times of the convergence "NG") is within the prescribed range (for example, less than 5 times) or not (step a6 of FIG. 4) . If the number of times which exceeded the limit of the convergence range is within the prescribed range ("Yes" route of step a6 of FIG. 4), the frequency control processing is performed (step a7 of FIG. 4).

Further, when the number of times which exceeded the limit of the convergence range is out of the prescribed range ("No" route of step a6 of FIG. 4), after restoring previous value just reached the limit of the convergence range (step a8 of FIG. 4), then the frequency control processing employing this first counter 201 is forcibly completed. On the other hand, when the number of times which exceeded the limit of the convergence range is within the prescribed range, and when there is no out of synchronization of the input signal ("Yes" route of step a5 of FIG. 4), the frequency control processing will be completed.

Referring to the flow chart shown in FIG. 5 (from step b1 to step b4), above mentioned frequency control processing will now be explained in more detail specifically. In the control pulse generation circuit 210, the control pulse signal is generated based on a signal outputted from the selection circuit 207 (step b1 of FIG. 5). This control pulse signal is up-down-counted by the up/down counter 211 (step b2 of FIG. 5), then converted into an analog signal in the digital to analog conversion circuit 212 (step b3 of FIG. 5). This analog signal is outputted to the local oscillator 31 as the oscillation frequency control signal (step b4 of FIG. 5), and the frequency of the received signal is controlled consequently.

Therefore, according to the automatic frequency control circuit 20 of the present invention, when drift of the received frequency exceeds the limit of the follow up of the demodulator circuit 16, the frequency of the regenerative carrier signal can be controlled within the limit of the follow up range, by counting the received IF signal directly using an auxiliary counter (the second counter 204), thus the follow up range of the automatic frequency control circuit can be expanded, and the processing capability is greatly increased.

Furthermore, according to the first preferred embodiment of this invention, the automatic frequency control circuit 20 can automatically control frequency in stability, even if a low stability and low cost reference local oscillator may be employed for the synthesizer unit 3. Accordingly, the portable telephone terminal 60 may precisely control transmission and reception frequency, thus the automatic frequency control circuit can contribute to performance enhancement of this equipment.

Figure 6:
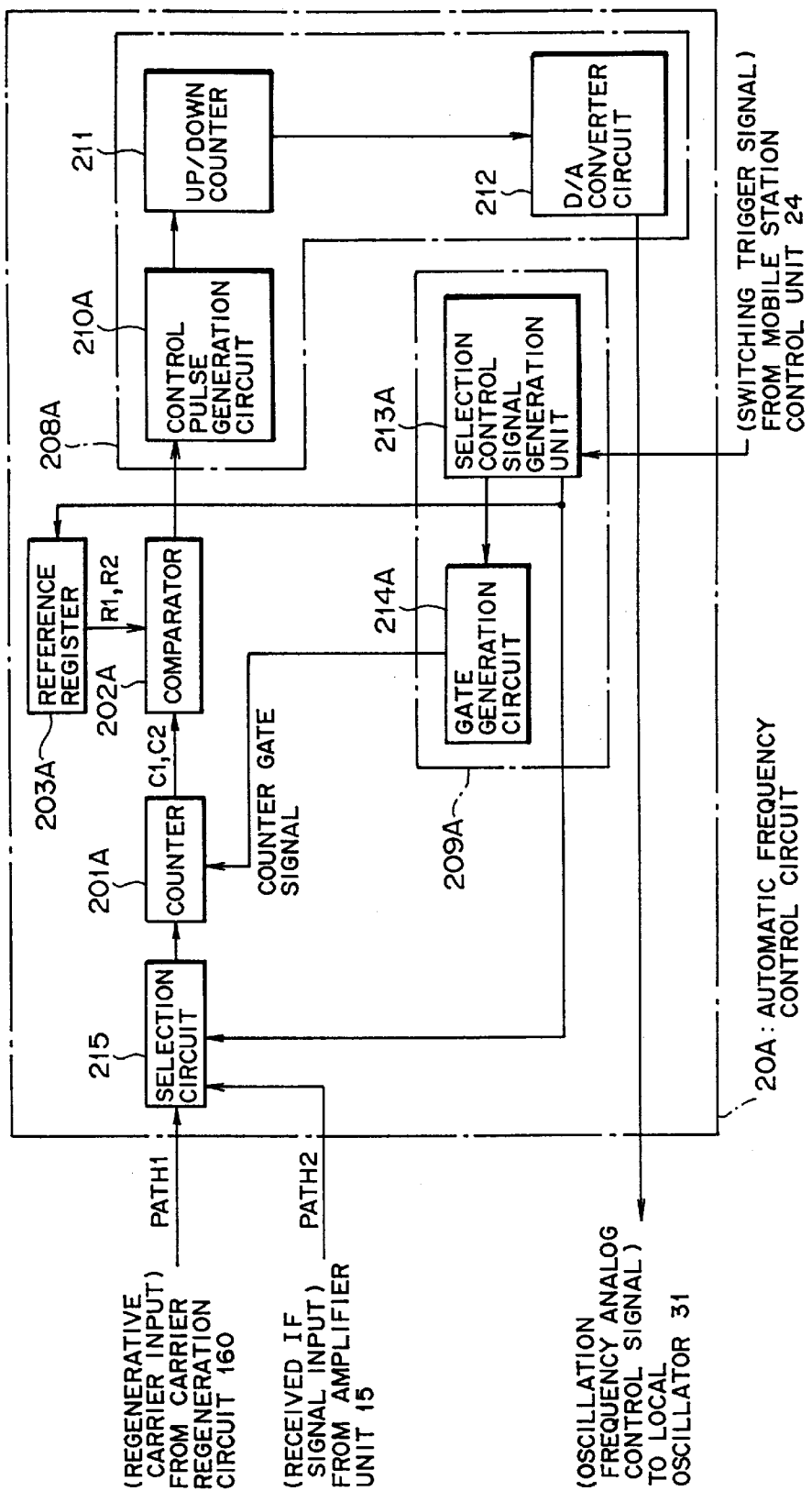
FIG. 6 is a block diagram showing configuration of automatic frequency control circuit according to the second embodiment of the invention.

(b) Detailed description of the second preferred embodiment of the present invention FIG. 6 is a block diagram showing a configuration of an automatic frequency control circuit (AFC circuit) 20A according to the second preferred embodiment of the invention. As shown in this FIG. 6, the automatic frequency control circuit 20A includes a counter 201A, a comparator 202A, a reference register 203A, a control pulse generation circuit 210A, an up/down counter 211, a digital to analog conversion circuit 212, a selection control signal generation unit 213A, a gate generation circuit 214A and a selection circuit 215. Incidentally, because same reference character as previously explained represents same or almost same items, the detailed description will be omitted.

At this point, the selection circuit 215 selects either the frequency of the regenerative carrier signal generated based on the incoming received signal (received IF signal) (PATH 1) or the frequency of the received signal (PATH 2), based on the selection control signal from the selection control signal generation unit 213A which will be mentioned later. Specifically, in the selection circuit 215, the frequency of the incoming regenerative carrier signal is selected usually, however, when the signal exceeds the prescribed range, for example, when out of synchronization has been occurred, the selection circuit 215 switches to select the frequency of the received IF signal.

Furthermore, the counter 201A counts the frequency of the output from the selection circuit 215, and adjusts according to the prescribed counting time outputted from the gate generation circuit 214A which will be mentioned later. Specifically, when a signal selected in the selection circuit 215 is the regenerative carrier signal, the counter 201A adjusts according to counting of every 200 msec, for example, same as above mentioned first preferred embodiment. And when a signal selected in the selection circuit 215 is the received IF signal, the counter 201A adjusts according to counting of every 1 sec, for example.

Furthermore, the comparator 202A compares the output of the counter 201A [C1 or C2; precisely counted value (the first count value) or coarsely counted value (the second count value)] with the reference value. This reference value is outputted from the reference register 203A which will be mentioned later. Furthermore, the reference register (reference value setting circuit) 203A, having the first reference value for the regenerative carrier signal (R1) and the second reference value for the received signal (R2), selectively outputs these first reference value and second reference value, in response to the switching of the selection circuit 215 which will be mentioned later. Both of these first reference value and second reference value (theoretical values) are established in a design stage.

Specifically, this reference register 203A outputs the first reference value for the regenerative carrier signal, when the selection circuit 215 selects the regenerative carrier signal, and outputs the second reference value for the received signal when the selection circuit 215 selects the received signal. Each reference value is compared with each count value of each signal respectively, in the comparator 202A (C1–R1 or C2–R2).

Furthermore, the control pulse generation circuit 210A generates the control pulse signal, based on the output from the comparator 202A. The control pulse generation circuit 210A and the up/down counter 211 are configured as frequency control signal generation unit 208A. In other words, this frequency control signal generation unit 208A outputs the frequency control signal to perform required operation for the frequency control processing of the received signal frequency, based on the output from the comparator 202A.

Furthermore, the selection control signal generation unit 213A generates the selection control signal for selecting either the regenerative carrier signal generated based on the received signal or the received signal, its output is outputted to the gate generation circuit 214A, the selection circuit 215 and the reference register 203A, which will be mentioned later. Specifically, as above mentioned first preferred embodiment, the selection control signal is outputted, based on the switching trigger signal from the mobile station control unit 24 shown in FIG. 1.

In other words, usually, the selection circuit 215 is set to select the regenerative carrier signal of PATH 1, and the reference register 203A is set to output the first reference value. When the number of times that frequency of the incoming signal (regenerative carrier signal) exceeded the limit of the convergence range is out of the prescribed range, by this selection control signal, selection of the selection circuit 215 is switched to the received IF signal of PATH 2, and output from the reference register 203A is switched to the second reference value.

Furthermore, the gate generation circuit 214A outputs counting time of the counter 201A, based on the selection control signal from the selection control signal generation unit 213A. Specifically, in this second preferred embodiment, the gate generation circuit 214A outputs the counter gate signal (enable signal), in every 200 msec when the regenerative carrier signal (PATH 1) is selected, and in every 1 sec when the received IF signal (PATH 2) is selected.

Furthermore, above mentioned selection control signal generation unit 213A and gate generation circuit 214A are configured as control signal output unit 209A. This control signal output unit 209A outputs selective switching control signal in response to the incoming received signal. Consequently, in the second preferred embodiment, both of the frequency control processing by existing precision counter and new coarse counter can be performed in a single counter 201A.

By such configuration, the automatic frequency control circuit 20A according to the second preferred embodiment of the present invention, as shown in FIG. 6, usually counts the frequency of the regenerative carrier signal which is generated based on the incoming received signal, in the counter 201A via the selection circuit 215, then, compares with the reference value in the comparator 202A. Then, based on the comparing result, the control pulse generation circuit 210A generates the control pulse signal, the up/down counter 211 increases or decreases corresponding count value with the control pulse signal, and outputs the frequency control signal, outputs to the local oscillator 31 as oscillation frequency analog signal, by analog conversion in the analog to digital conversion circuit 212.

Incidentally, during the course of the series of above mentioned processing, once frequency drift is produced and becomes large, then frequency follow up operation becomes insufficient from the regenerative carrier signal. In this case, the frequency control processing will be performed, by switching the frequency used for this automatic frequency control circuit 20A to the frequency of the received IF signal (PATH 2), according to the decision of the mobile station control unit 24.

Hereinafter, referring to the flow chart shown in FIG. 7 (from step c1 to c12), the method of the automatic frequency control by the automatic frequency control circuit 20A at this time, will be explained in more detail. First of all, when the regenerative carrier signal and the received IF signal is inputted, the selection circuit 215 selects the regenerative carrier signal from PATH 1 (step c1 of FIG. 7), and after having precision counted in the counter 201A [the first count value (C1); step c2 of FIG. 7], compares this first count value (C1) with the first reference value (R1) (step c3 of FIG. 7). From this comparing result, the decision will be made whether the frequency of the input signal is within the convergence range or not (step c4 of FIG. 7).

As a result of this decision, when the number of times which exceeded the limit of the convergence range is within the prescribed range, and when there is no out of synchronization of the input signal ("Yes" route of step c4 of FIG. 7), the frequency control processing will be completed. However, when it is out of the convergence range ("No" route of step c4 of FIG. 7), the decision will be made whether the number of times which exceeded the limit of the convergence range (number of times of the convergence "NG") is within the prescribed range or not (step c5 of FIG. 7). Then, if the number of times which exceeded the limit of the convergence range is within the prescribed range ("Yes" route of step c5 of FIG. 7), the frequency control processing is performed (step c6 of FIG. 7).

Figure 7:
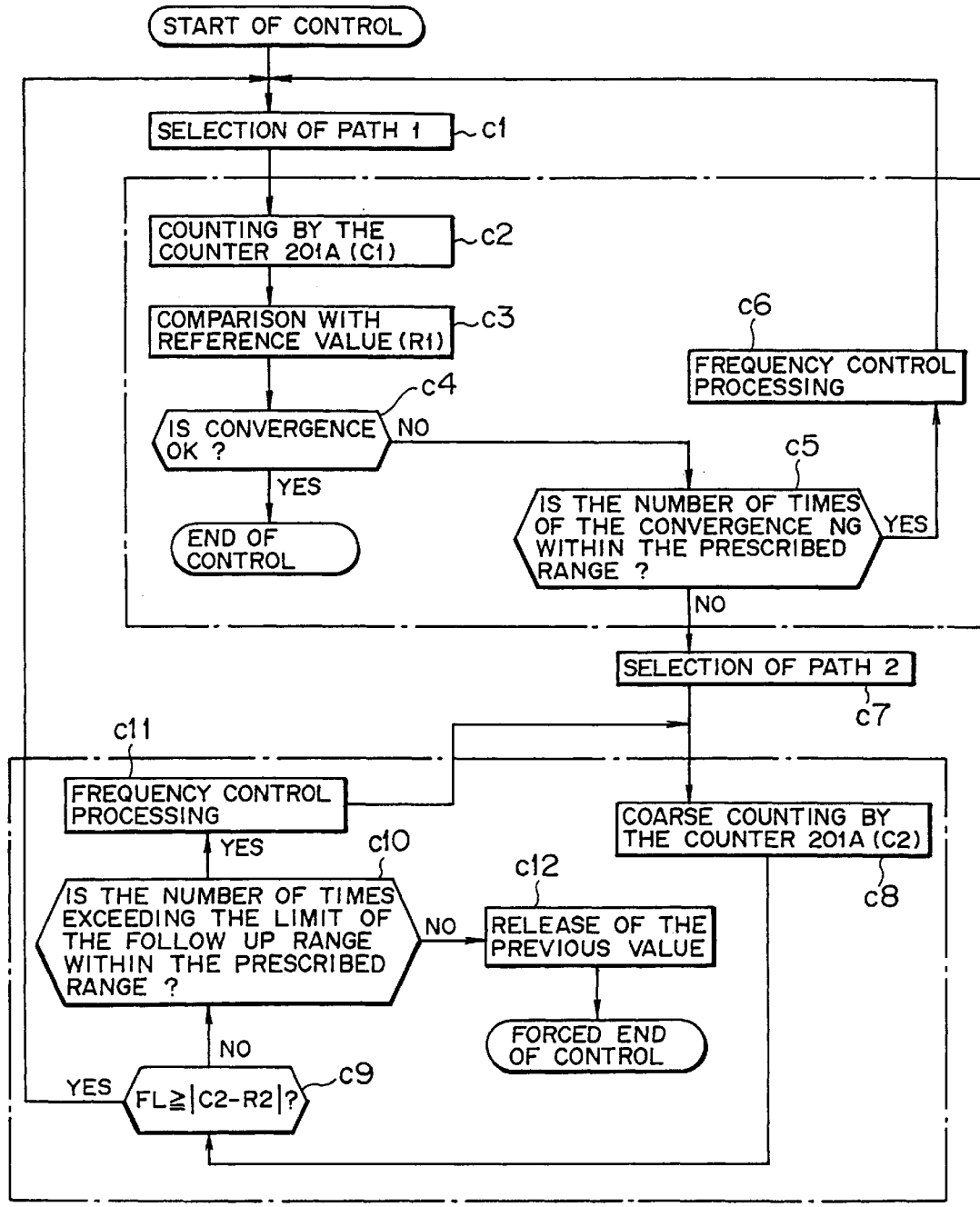
FIG. 7 is a flow chart explaining operation of automatic frequency control circuit according to the second embodiment of the invention.

Furthermore, when the number of times that the frequency of the incoming signal exceeded the limit of the convergence range is out of the prescribed range ("No" route of step c5 of FIG. 7), PATH 2 (received IF signal) is selected in the selection circuit 215 (step c7 of FIG. 7), and the counter 201A coarsely counts [the second count value (C2); step c8 of FIG. 7]. Thereafter, the counter 201A compares this second count value (C2) with the second reference value (R2), and from this comparing result, the decision is made whether the difference between the second count value and the second reference value (C2–R2) is within the limit of the follow up range on the basis of the regenerative carrier signal or not (step c9 of FIG. 7).

From the result of the decision, when the difference between the second count value and the second reference value exceeds the limit of the follow up range mentioned above ("No" route of step c9 in FIG. 7), the decision is made again whether the number of times which exceeded the limit of the follow up range is within the prescribed range or not (step c10 of FIG. 7), and when the number of times which exceeded the limit of the follow up range is within the prescribed range ("Yes" route of step c10 of FIG. 7), the frequency control processing is performed (step c11 of FIG. 7).

Furthermore, when the number of times which exceeded the follow up range exceeds the prescribed range ("No" route of step c10 of FIG. 7), after restoring previous value just reached the limit of the follow up range (step c12 of FIG. 7), then the frequency control processing employing the counter 201A will be forcibly completed. On the other hand, in above mentioned step c9 of FIG. 7, when the difference between the second count value and the second reference value does not exceed the limit of the follow up range ("Yes" route of step c9 of FIG. 7), PATH 1 (step c1 of FIG. 7) is selected again and the frequency control processing of step from c2 to c6 of FIG. 7 will be performed.

In this manner, according to the automatic frequency control circuit 20A of the second preferred embodiment of the present invention, because a single counter 201A can count by switching counting speed in response to the input signal based on the received signal, circuit configuration can be reduced, and the whole equipment can be configured in light weight, thus reduction of cost will be achieved.

(b1) Detailed description of the example of the variation of the second preferred embodiment In above mentioned second preferred embodiment, the selection circuit 215A usually selects the frequency of the regenerative carrier signal of PATH 1 in the input signal, and when the number of times that the frequency of the incoming signal exceeded the limit of the convergence range is out of the prescribed range, the selection circuit 215A switches to the input of the frequency of the received IF signal of PATH 2, and the frequency control processing by coarse counting is performed. However, in the variation of the second preferred embodiment, the selection circuit 215A selects the frequency of the received IF signal of PATH 2 at first, and after coarsely counting the received IF signal, when the input signal is within the limit of the follow up range on the basis of the regenerative carrier signal, switches to the regenerative carrier signal of PATH 1, then the frequency control processing is performed. In other words, in this method, the frequency control by precision counting is performed according to the result of decision by coarse counting.

Accordingly, the method of the frequency control in the variation of the second preferred embodiment, will be explained hereinafter with reference to the flow chart shown in FIG. 8 (from step d1 to d13). Firstly, when the regenerative carrier signal and the received IF signal is inputted, the selection circuit 215 selects PATH 2 (received IF signal) (step d1 of FIG. 8). The counter 201A coarsely counts the received IF signal [the second count value (C2) ; step d2 of FIG. 8] and compares this second count value (C2) with the second reference value (R2) From this comparing result, the decision is made whether the difference between the second count value and the second reference value (C2–R2) is within the limit of the follow up range on the basis of the regenerative carrier signal or not ("FL$\geq$|C2–R2|?"; step d3 of FIG. 8).

Figure 5:
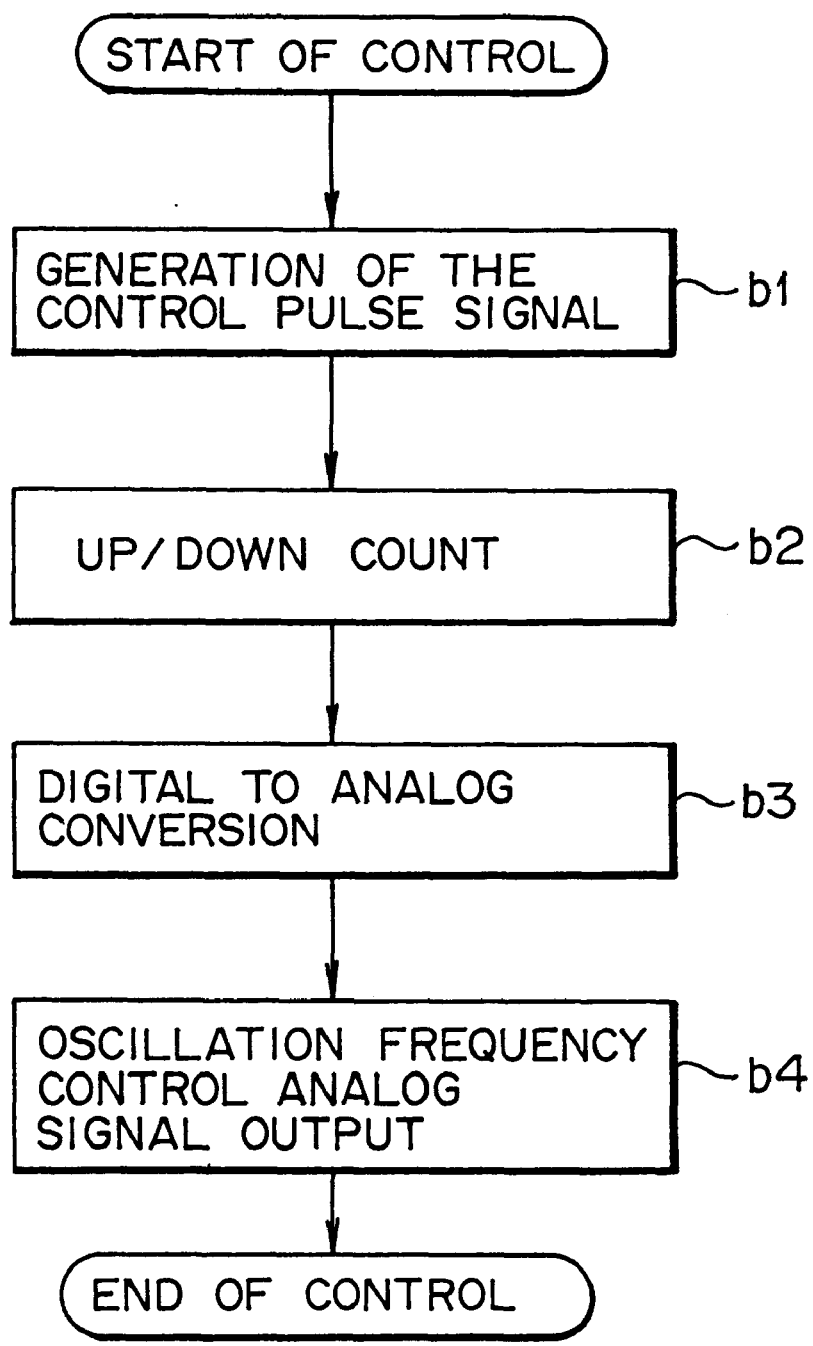
FIG. 5 is a flow chart partially explaining operation of automatic frequency control circuit according to the first embodiment of the invention.

From the result of the decision, when the difference between the second count value and the second reference value exceeds the limit of the follow up range mentioned above ("No" route of step d3 in FIG. 8), the decision is made again whether the number of times which exceeded the limit of the follow up range is within the prescribed range or not (the number of times exceeding the limit of the follow up range) (step d4 of FIG. 8), and when the number of times which exceeded the limit of the follow up range is within the pre scribed range ("Yes" route of step d4 of FIG. 8) similar frequency control processing as shown in FIG. 5 is performed (step d5 of FIG. 8).

On the other hand, when the number of times which exceeded the limit of the follow up range exceeds the prescribed range ("No" route of step d4 of FIG. 8), after restoring previous value just reached the limit of the follow up range (step d6 of FIG. 8), then the frequency control processing employing coarse counting by the counter 201A is forcibly completed. Furthermore, in above mentioned step d3, when the difference between the second count value and the second reference value does not exceed the limit of the follow up range on the basis of the regenerative carrier signal ("Yes" route of step d3 of FIG. 8), the selection circuit 215 selects PATH 1 (step d7 of FIG. 8), and after having precision counted in the counter 201A [the first count value (C1); step d8 of FIG. 8], compares this first count value (C1) with the first reference value (R1) (step d9 of FIG. 8).

From this comparing result, the decision will be made whether the frequency of the input signal is within the convergence range or not ("convergence OK ?"; step d10 of FIG. 8). As a result of this decision, when the frequency of the input signal is within the convergence range and when there is no out of synchronization of the input signal, the frequency control processing will be terminated ("Yes" route of step d10 of FIG. 8). However, when it is out of the convergence range ("No" route of step d10 of FIG. 8), the decision will be made again whether the number of times which exceeded the limit of the convergence range is within the prescribed range or not (step d11 of FIG. 8).

Figure 8:
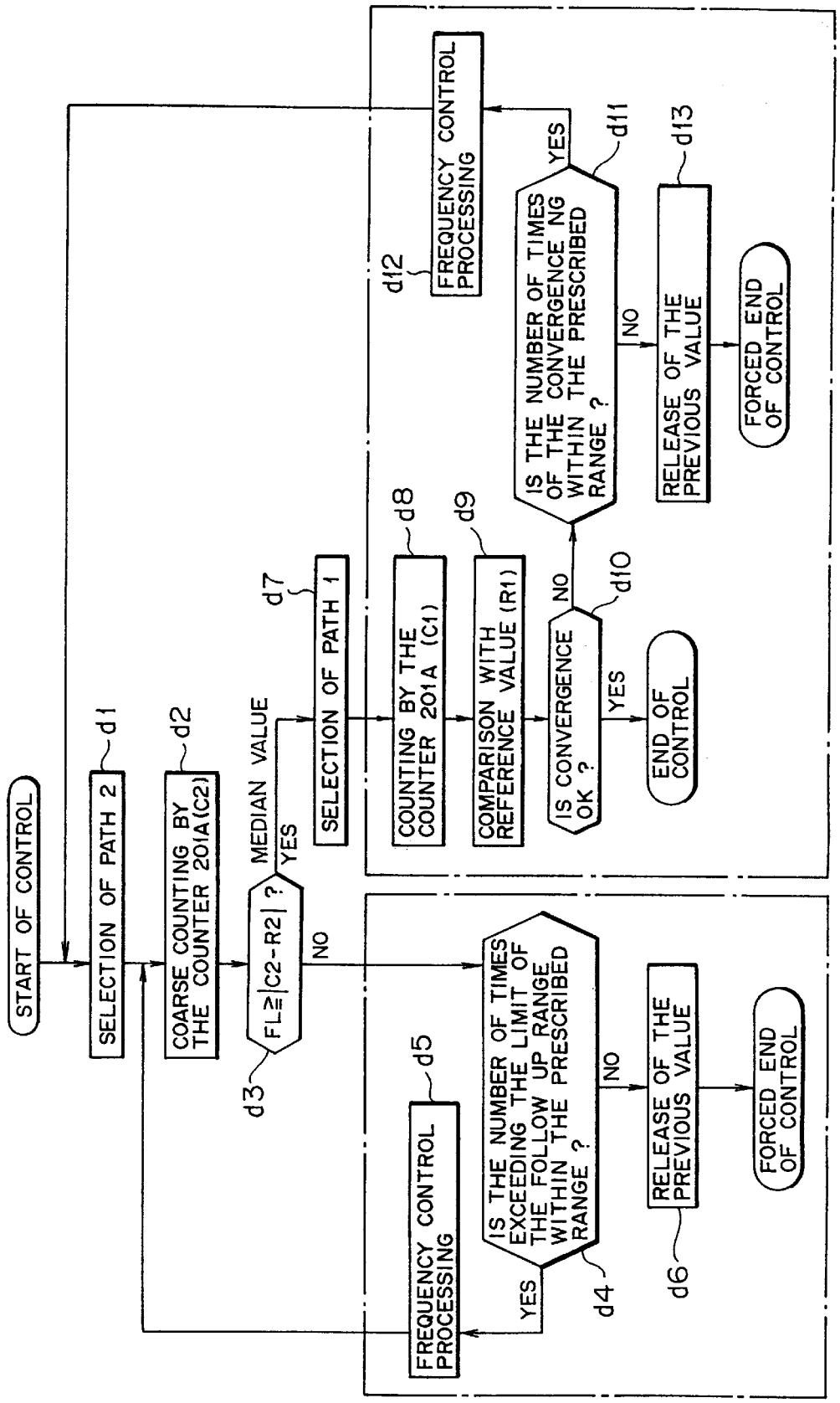
FIG. 8 is a flow chart explaining operation of automatic frequency control circuit according to an example of variation of the second embodiment of the invention.
Figure 9:
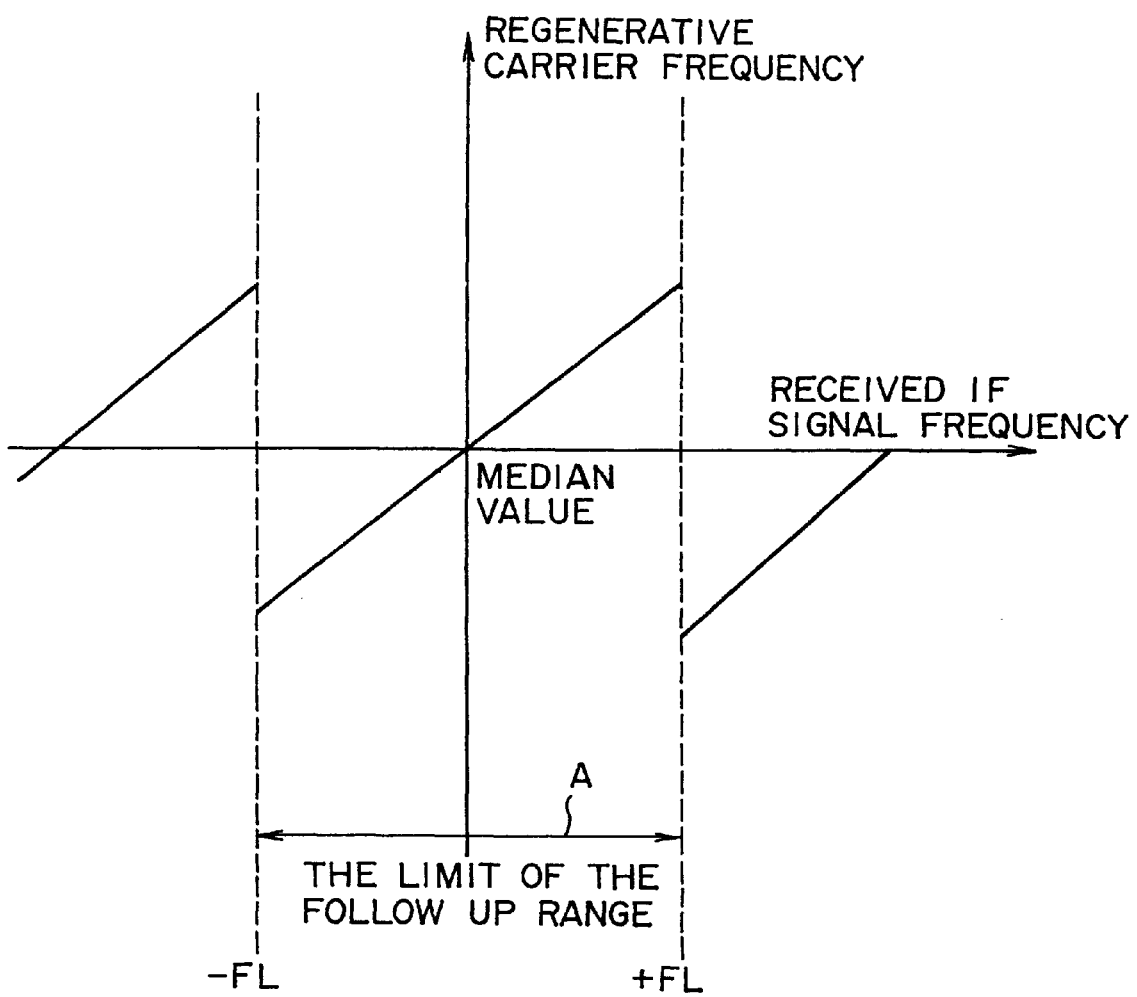
FIG. 9 is a figure showing example of input and output characteristics of a carrier regeneration circuit configured with a general digital circuitry.

As a result, when the number of times which exceeded the limit of the convergence range is within the prescribed range ("Yes" route of step d11 of FIG. 8), the frequency control processing is performed (step d12 of FIG. 8). When the number of times which exceeded the limit of the convergence range is out of the prescribed range ("No" route of step d11 of FIG. 8), after restoring previous value just reached the limit of the convergence range (step d13 of FIG. 8), then the frequency control processing employing coarse counting by the counter 201A is forcibly completed.

Consequently, in this case as well, because a single counter 201A can count by switching counting speed in response to the input signal based on the received signal, the same advantage as above mentioned second preferred embodiment can be obtained. Furthermore, because the counter can rapidly respond to different speed counting process which is started in either speed, flexibility of the system configuration of the equipment will be achieved.

(c) Others

Furthermore, in the above mentioned second preferred embodiment, although switching of the two modes between the first counter (precision counter) 201 and the second counter (coarse counter) 204 is performed by the mobile station control unit 24 configured by the central processing unit and firm-ware, the present invention is not limited to this preferred embodiment, but the software control by micro processor unit or the random logic control may be employed. Although the preferred embodiments have been described in detail, it should be understood that various changes, substitutions and alterations not limited to the portable telephone terminal, can be made therein without departing from the spirit and scope of the invention as defined by the appended claims.

What is claimed is:

1. Automatic frequency control circuit for processing frequency control of received signal frequency based on incoming received signal, comprising;

a first control circuit for outputting a first frequency control signal based on a precision counter by using said incoming received signal; and a second control circuit for outputting a second frequency control signal based on a coarse counter by using said incoming received signal;

a selection circuit for selecting either of output from said first control circuit and said second control circuit interchangeably based on said incoming received signal a selection circuit for selecting either of output from said first control circuit and said second control circuit interchangeably based on said incoming received signal.

2. Automatic frequency control circuit for processing frequency control of received signal frequency based on incoming received signal, comprising;

a first counter for counting frequency of regenerative carrier signal which is generated based on said incoming received signal;

a second counter for counting frequency of said incoming received signal;

a first reference value setting circuit having first reference value for regenerative carrier signal;

a second reference value setting circuit having second reference value for received signal;

a first comparator for comparing the first reference value outputted from said first reference value setting circuit with the output of said first counter;

a second comparator for comparing the second reference value outputted from said second reference value setting circuit with the output of said second counter;

a selection circuit for selecting either of output from said first comparator and output from said second comparator;

a frequency control signal generation unit for outputting frequency control signal for processing frequency control of said received signal frequency based on the output of said selection circuit;

a control signal output unit for outputting selective switching control signal in response to said incoming received signal.

3. Automatic frequency control circuit as claimed in claim 2, wherein said frequency control signal generation unit comprises;

a control pulse generation circuit for generating control pulse signal based on output from said selection circuit; and an up/down counter outputting said frequency control signal by increasing or decreasing count value in response to said control pulse signal from said control pulse generation circuit.

4. Automatic frequency control circuit as claimed in claim 2, wherein said control signal output unit comprises;

a selection control signal generation unit for outputting selection control signal for selecting either of output from said first comparator and output from said second comparator; and a gate generation circuit for outputting each of the counting time in said first counter and in said second counter based on said selection control signal from said selection control signal generation unit.

5. Automatic frequency control circuit for processing frequency control of received signal frequency based on the incoming received signal, comprising;

a selection circuit selecting either of frequency of regenerative carrier signal generated based on said incoming received signal and frequency of said received signal;

a counter for counting frequency of said output by receiving output of said selection circuit;

a reference value setting circuit having first reference value for regenerative carrier signal and second reference value for received signal, and selectively outputting said first reference value and said second reference value in response to switching of said selection circuit;

a comparator comparing the first reference value and the second reference value selectively outputted from said reference value setting circuit with the output of said counter;

a frequency control signal generation unit for outputting frequency control signal for processing frequency control of said received signal frequency based on the output of said comparator; and a control signal output unit for outputting selective switching control signal in response to said incoming received signal.

6. Automatic frequency control circuit as claimed in claim 5, wherein said frequency control signal generation unit comprises;

a control pulse generation circuit for generating control pulse signal based on output from said comparator; and an up/down counter for outputting said frequency control signal by increasing or decreasing count value in response to said control pulse signal from said control pulse generation circuit.

7. Automatic frequency control circuit as claimed in claim 5, wherein said control signal output unit comprises;

a selection control signal generation unit for outputting selection control signal for selecting output of either of frequency of regenerative carrier signal generated based on said received signal and frequency of said received signal; and a gate generation circuit for outputting the counting time in said counter based on said selection control signal from said selection control signal generation unit.

8. Method of automatic frequency control, wherein automatic frequency control circuit includes precision counter and coarse counter each counting frequency of the received signal based on the input signal resulting from the received signal, comprising the steps of;

said input signal being precision counted and coarse counted by said precision counter and said coarse counter respectively;

coarsely counted value counted by said coarse counter being compared with reference value for coarse counting, and from this comparing result, decision being made whether difference between said coarsely counted value and said reference value for coarse counting stays within the limit of the follow up range on the basis of regenerative carrier signal;

from a result of this decision, when the difference between said coarsely counted value and said reference value for coarse counting exceeds the limit of the follow up range, while processing frequency control, as long as the number of times which exceeded said limit of the follow up range is within the prescribed range;

when the difference between said coarsely counted value and said reference value for coarse counting does not exceed the limit of the follow up range, decision being made whether the frequency of said input signal stays within the convergence range, from comparing result of precisely counted value counted by said precision counter with reference value for precision counting;

when the frequency of said input signal exceeds the convergence range, while processing said frequency control, as long as the number of times which exceeded said convergence range is within the prescribed range; and then frequency control processing being terminated, when the frequency of said input signal stays within the convergence range, and when there is no out of synchronization in said input signal.

9. Method of automatic frequency control as claimed in claim 8, wherein frequency control processing employs said precision counter, comprising the steps of;

restoring previous value just reached the limit of the convergence range mentioned above, when the number of times which exceeded said convergence range exceeds the prescribed range;

then frequency control processing employing said precision counter being forcibly terminated.

10. Method of automatic frequency control as claimed in claim 8, wherein frequency control processing employs said coarse counter, comprising the steps of;

restoring previous value just reached the limit of the follow up range, when the number of times which exceeded said follow up range exceeds the prescribed range;

then frequency control processing employing said coarse counter being forcibly completed.

11. Method of automatic frequency control, wherein automatic frequency control circuit includes counter precisely and coarsely counting frequency of the received signal based on input signal resulting from the received signal, comprising the steps of;

precisely counting said input signal by said counter;

precisely counted value precisely counted by said counter being compared with reference value for precision counting;

from this comparing result, decision being made whether the frequency of said input signal stays within the convergence range;

while frequency control processing being completed, when the frequency of said input signal stays within the convergence range and when there is no out of synchronization in said input signal;

when the frequency of said input signal exceeds said convergence range, while processing said frequency control, as long as the number of times which exceeded said convergence range is within the prescribed range;

when the number of times which exceeded said convergence range exceeds the prescribed range, coarsely counting by said coarse counter;

coarsely counted value coarsely counted by said counter being compared with reference value for coarse counting; and then based on this comparing result, processing said frequency control.

12. Method of automatic frequency control as claimed in claim 11, wherein frequency control processing employs coarse counting by said coarse counter, comprising the steps of;

restoring previous value just reached the limit of the follow up range, when the number of times where the difference between said coarsely counted value and the reference value for coarse counting exceeded the limit of the follow up range on the basis of regenerative carrier signal exceeds the prescribed range, then frequency control processing employing coarse counting by said counter being forcibly completed.

13. Method of automatic frequency control, wherein automatic frequency control circuit includes counter precisely and coarsely counting frequency of the received signal based on input signal resulting from the received signal, comprising the steps of;

coarsely counting said input signal by said counter coarsely counted value coarsely counted by said counter being compared with reference value for coarse counting;

from this comparing result, decision being made whether the difference between said coarsely counted value and said reference value for coarse counting stays within the limit of the follow up range on the basis of regenerative carrier signal;

from the result of this decision, when the difference between said coarsely counted value and said reference value for coarse counting exceeds the limit of the follow up range, while processing frequency control, as long as the number of times which exceeded said limit of the follow up range is within the prescribed range;

when the difference between said coarsely counted value and said reference value for coarse counting does not exceed the limit of the follow up range, after precisely counting said counter, precisely counted value precisely counted by said counter being compared with the reference value for precision counting;

from this comparing result, decision being made whether the frequency of said input signal stays within the convergence range;

while frequency control processing being completed, when the frequency of said input signal stays within the convergence range, and when there is no out of synchronization in said input signal;

when the frequency of said input signal exceeds said convergence range, processing said frequency control, as long as the number of times which exceeded said convergence range is within the prescribed range.

14. Method of automatic frequency control as claimed in claim 13, wherein frequency control processing employs coarse counting by said counter, comprising the steps of;

restoring previous value just reached the limit of the follow up range, when the number of times exceeded said limit of the follow up range exceeds the prescribed range, then frequency control processing employing coarse counting by said counter being forcibly terminated.

15. Method of automatic frequency control as claimed in claim 13, wherein frequency control processing employs precision counting by said counter, comprising the steps of;

restoring previous value before exceeding the limit of the convergence range, when the number of times exceeded said limit of the convergence range exceeds the prescribed range, then frequency control processing employing precision counting by said counter being forcibly terminated.

* * * * *